(12) United States Patent
Mekking et al.

(10) Patent No.: US 10,942,444 B2
(45) Date of Patent: Mar. 9, 2021

(54) OPTICAL CONTROL MODULES FOR INTEGRATED CIRCUIT DEVICE PATTERNING AND RETICLES AND METHODS INCLUDING THE SAME

(71) Applicant: NXP USA, Inc., Austin, TX (US)

(72) Inventors: Leendertjan Mekking, Nijmegen (NL); Johannes Cobussen, Beuningen (NL); Antonius Hendrikus Jozef Kamphuis, Lent (NL)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/400,261

(22) Filed: May 1, 2019

(65) Prior Publication Data
US 2020/0348587 A1 Nov. 5, 2020

(51) Int. Cl.
| | |
|---|---|
| *G03F 1/42* | (2012.01) |
| *B23K 26/359* | (2014.01) |
| *B23K 26/00* | (2014.01) |
| *G03F 7/20* | (2006.01) |
| *H01L 21/027* | (2006.01) |
| *H01L 21/268* | (2006.01) |

(Continued)

(52) U.S. Cl.
CPC ............ *G03F 1/42* (2013.01); *B23K 26/0006* (2013.01); *B23K 26/359* (2015.10); *G03F 7/2022* (2013.01); *G03F 7/2024* (2013.01); *H01L 21/0274* (2013.01); *H01L 21/268* (2013.01); *H01L 21/78* (2013.01); *H01L 23/544* (2013.01); *G03F 7/162* (2013.01); *H01L 2223/5446* (2013.01)

(58) Field of Classification Search
CPC .................... H01L 22/34; H01L 21/78; H01L 2223/54453; H01L 23/544; H01L 27/0203; H01L 21/0274–0275; G03F 7/70433; G03F 1/44; G03F 7/70425; G03F 7/70683; G03F 9/7084; G03F 1/42; G03F 7/2022; G03F 7/2024
See application file for complete search history.

(56) References Cited

U.S. PATENT DOCUMENTS

| | | |
|---|---|---|
| 6,027,859 A | 2/2000 | Dawson et al. |
| 6,118,517 A | 9/2000 | Sasaki et al. |

(Continued)

FOREIGN PATENT DOCUMENTS

JP    2006147871 A    6/2006

*Primary Examiner* — Bac H Au

(57) ABSTRACT

Optical control modules for integrated circuit device patterning and reticles and methods including the same. The methods include exposing, via a reticle, initial and subsequent reticle exposure fields on a surface of a semiconductor substrate. The initial and subsequent reticle exposure fields pattern corresponding array regions and margin regions on the semiconductor substrate. The initial and subsequent reticle exposure fields partially overlap such that an initial optical control module (OCM), which is patterned during exposure of the initial reticle exposure field, and a subsequent OCM, which is patterned during exposure of the subsequent reticle exposure field, both are positioned within a single control module die. The reticles include reticles that can be utilized during the methods or that can form the integrated circuit devices. The integrated circuit devices include integrated circuit devices formed utilizing the methods or the reticles.

11 Claims, 9 Drawing Sheets

(51) Int. Cl.
*H01L 21/78* (2006.01)
*H01L 23/544* (2006.01)
*G03F 7/16* (2006.01)

(56) References Cited

U.S. PATENT DOCUMENTS

| | | |
|---|---|---|
| 6,486,954 B1 | 11/2002 | Mieher et al. |
| 6,680,523 B2 | 1/2004 | Schober et al. |
| 7,189,496 B2 * | 3/2007 | Saluel .................. G03F 7/0007 430/319 |
| 7,456,489 B2 | 11/2008 | Scheucher |
| 7,538,444 B2 | 5/2009 | Scheucher et al. |
| 8,264,092 B2 * | 9/2012 | Scheucher .......... H01L 21/6835 257/797 |
| 8,349,708 B2 | 1/2013 | Scheucher et al. |
| 8,415,769 B2 * | 4/2013 | Scheucher ............ H01L 23/544 257/620 |
| 9,620,456 B2 * | 4/2017 | Scheucher ............ H01L 23/544 |
| 9,798,228 B2 | 10/2017 | Cobussen et al. |
| 2005/0089769 A1 | 4/2005 | Fu |
| 2005/0118514 A1 | 6/2005 | Tsai |
| 2008/0014511 A1 | 1/2008 | Yoo et al. |
| 2014/0151699 A1 | 6/2014 | Wu et al. |
| 2018/0164688 A1 * | 6/2018 | Chang ................. G03F 7/70625 |
| 2018/0210332 A1 * | 7/2018 | Slonaker ............... G03F 7/2004 |

* cited by examiner

US 10,942,444 B2

OPTICAL CONTROL MODULES FOR INTEGRATED CIRCUIT DEVICE PATTERNING AND RETICLES AND METHODS INCLUDING THE SAME

FIELD

This disclosure relates generally to photolithography, and more specifically, to optical control modules utilized to align adjacent reticle exposure fields during patterning of integrated circuit devices.

BACKGROUND

A plurality of integrated circuit devices generally is fabricated on a single semiconductor substrate. This fabrication process includes patterning of individual layers of the integrated circuit devices, on the semiconductor substrate, utilizing photolithography techniques. Such photolithography techniques utilize a separate reticle, which includes patterning information regarding an individual layer, to pattern each individual layer of the integrated circuit device. In practice, the reticle only is utilized to pattern a fraction of a plurality of integrated circuit devices, such as may be defined within a reticle field of the reticle. In order to pattern all of the integrated circuit devices that will be fabricated on the semiconductor substrate, the reticle field is stepped across a surface of the semiconductor substrate, thereby patterning repeated instances of the reticle exposure field on the surface of the semiconductor substrate.

Optical control modules (OCMs) are utilized to align adjacent reticle exposure fields. Photolithography systems can utilize OCMs as reference structures during the patterning process, thereby permitting adjacent reticle exposure fields to be aligned in a regular grid, or pattern, on the surface of the semiconductor substrate.

Historically, OCMs were positioned within scribe lines that separated adjacent integrated circuit devices. Such an approach is effective for wide scribe lines, such as may be utilized when integrated circuit devices are singulated via mechanical sawing techniques. However, the semiconductor industry is moving toward narrower scribe lines in order to increase a density of integrated circuit devices on the semiconductor substrate. In these systems, integrated circuit devices are singulated utilizing laser scribing techniques, and the presence of OCMs within the scribe lines often may be detrimental to such laser scribing techniques.

More recently, the four corner die of a given reticle exposure field each have included a corresponding OCM. Such a configuration permits structure-free scribe lines, thereby permitting laser scribing techniques. However, within every reticle exposure field, four die must be sacrificed as OCMs, thereby decreasing an overall number of saleable integrated circuit devices that may be patterned on the semiconductor substrate.

BRIEF DESCRIPTION OF THE DRAWINGS

The present invention is illustrated by way of example and is not limited by the accompanying Figures, in which like references indicate similar elements. Elements in the Figures are illustrated for simplicity and clarity and have not necessarily been drawn to scale.

DETAILED DESCRIPTION

Semiconductor substrates or reticles according to the present disclosure include optical control modules (OCMs) that are arranged within a given reticle exposure field such that, upon patterning of four adjacent reticle exposure fields on a surface of a semiconductor substrate, a corresponding OCM formed by each of the four adjacent reticle exposure fields is positioned within a single control module die. In some embodiments, the four adjacent reticle exposure fields overlap with one another such that a corresponding OCM from each reticle exposure field is positioned within a single control module die. In some embodiments, reticles according to the present disclosure can include only a single die, or die location, that includes an OCM, with other OCMs that are patterned by the reticle being located external to a die array that is defined by the reticle. Such semiconductor substrates or reticles, as well as methods of forming the semiconductor substrates or of utilizing the reticles, can increase an overall number of integrated circuit devices formed on a given semiconductor substrate. This can decrease process overhead experienced during fabrication of integrated circuit devices or can decrease fabrication costs. This can be especially true when compared to conventional semiconductor substrates or reticles, where four die, or die locations, per reticle exposure field include OCMs.

Figure 1:
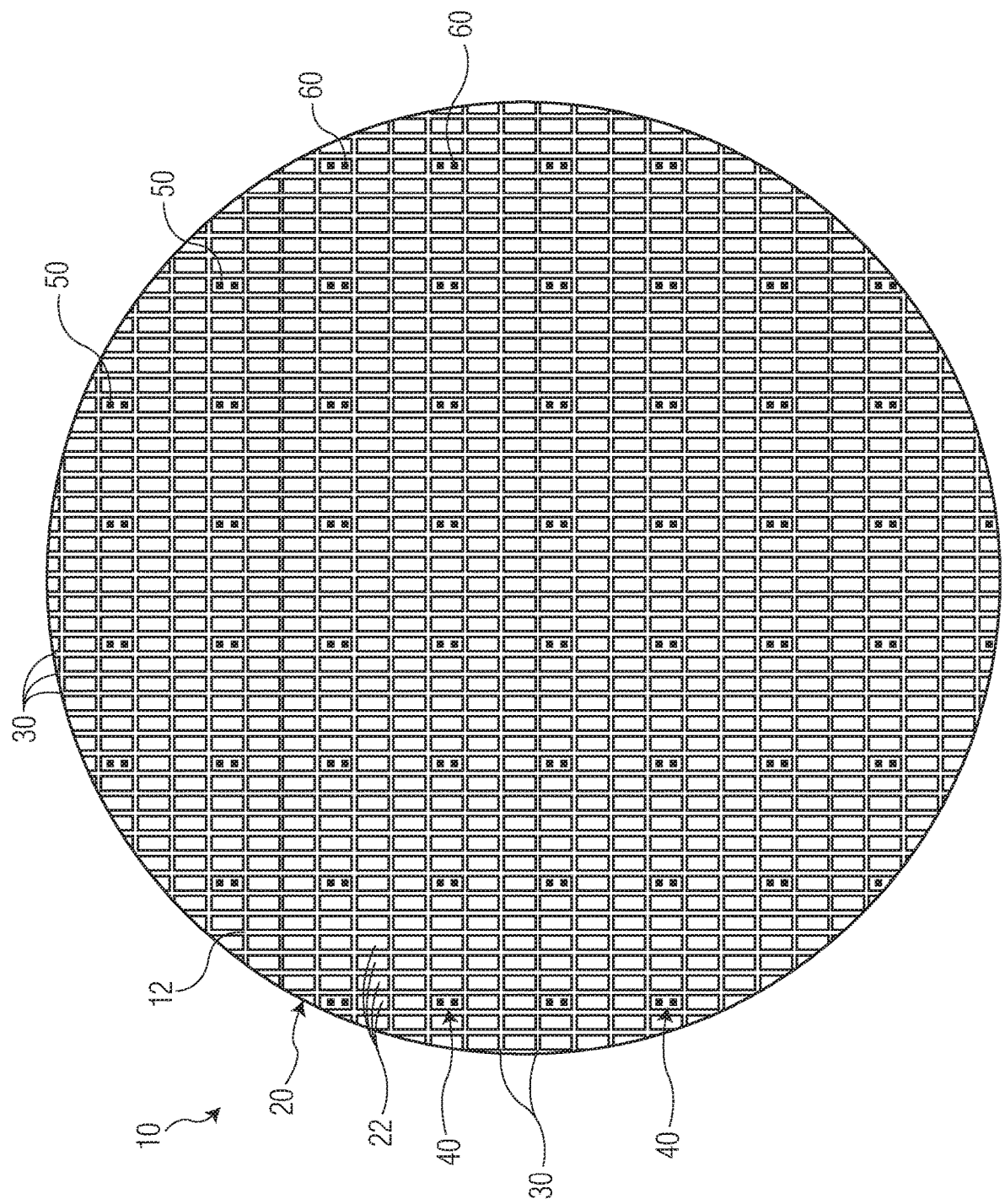
FIG. 1 is a schematic illustration of an example of a semiconductor substrate that can include a plurality of optical control modules, according to the present disclosure.
Figure 2:
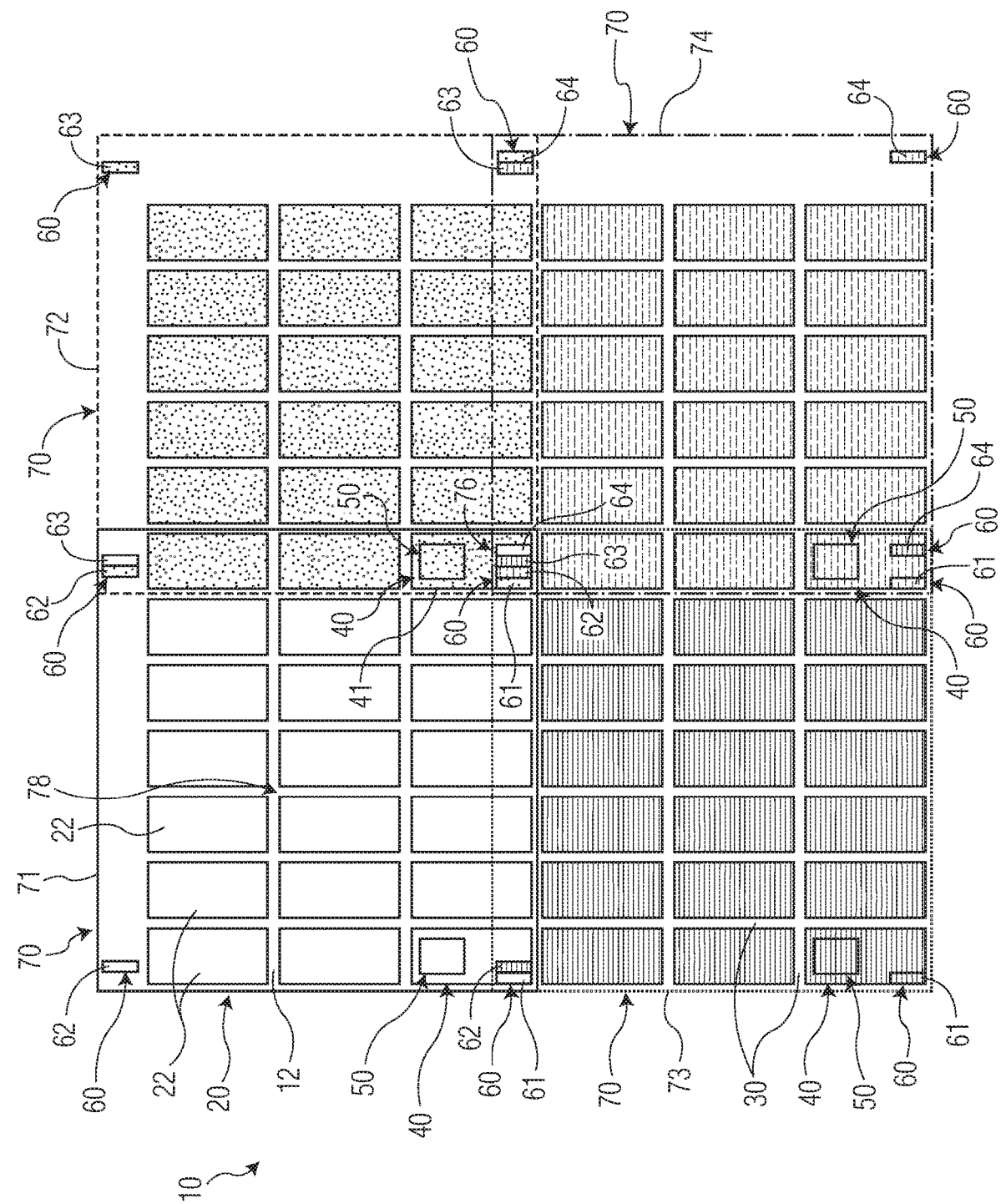
FIG. 2 is a schematic illustration of an example of four adjacent reticle exposure fields that can be formed on a semiconductor substrate, according to the present disclosure.

FIG. 1 is a schematic illustration of an example of a semiconductor substrate 10 that can include a plurality of optical control modules 60, according to the present disclosure. FIG. 2 is a more detailed but still schematic illustration of an example of four adjacent reticle exposure fields 70 that can be formed on semiconductor substrate 10, according to the present disclosure. As illustrated in FIGS. 1-2, semiconductor substrate 10 includes a plurality of integrated circuit devices 22 arranged in a die array 20 on a surface 12 of the semiconductor substrate. Semiconductor substrate 10 also includes a plurality of scribe lines 30, and scribe lines 30 separate adjacent integrated circuit devices 22. Semiconductor substrate 10 further includes a plurality of control module die 40 spaced-apart within die array 20. Control module die 40 include optical control modules (OCMs) 60 and also can include process control modules (PCMs) 50.

As illustrated by the central control module die 40 of FIG. 2, each control module die includes a first OCM 61, a second OCM 62, a third OCM 63, and a fourth OCM 64. As also illustrated in FIG. 2, die array 20 forms a repeating pattern that is formed by a plurality of partially overlapping reticle exposure fields 70. It is understood that integrated circuit devices 22 include a plurality of individual device layers; and, in this context, reticle exposure fields 70 illustrated in FIG. 2 can be reticle exposure fields associated with, or utilized to form, a single device layer of the integrated circuit devices.

In the example of FIG. 2, reticle exposure fields 70 include a first, or an initial, reticle exposure field 71, a second, or a subsequent, reticle exposure field 72, a third reticle exposure field 73, or a fourth reticle exposure field 74. First reticle exposure field 71 also can be referred to herein as or can be a first rectangular reticle exposure field 71, and second reticle exposure field 72 also can be referred to herein as or can be a second rectangular reticle exposure field 72. Similarly, third reticle exposure field 73 also can be referred to herein as or can be a third rectangular reticle exposure field 73, and fourth reticle exposure field 74 also can be referred to herein as or can be a fourth rectangular reticle exposure field 74.

As illustrated, first reticle exposure field 71 partially overlaps, along one side, with second reticle exposure field 72 and, along an adjacent side, with third reticle exposure field 73. Similarly, second reticle exposure field 72 partially overlaps along, along one side, with first reticle exposure field 71 and, along an adjacent side, with fourth reticle exposure field 74. In addition, third reticle exposure field 73 partially overlaps, along one side, with first reticle exposure field 71 and, along an adjacent side, with fourth reticle exposure field 74. Similarly, fourth reticle exposure field 74 partially overlaps, along one side, with second reticle exposure field 72 and, along an adjacent side, with third reticle exposure field 73. In addition, first reticle exposure field 71, second reticle exposure field 72, third reticle exposure field 73, and fourth reticle exposure field 74 all overlap with one another within an overlap region 76.

For simplicity, FIG. 2 only illustrates four reticle exposure fields 70. On a patterned, or a completely patterned, semiconductor substrate 10, reticle exposure fields 70 that are illustrated in FIG. 2 can be at least partially, or even completely, surrounded by other similar, or identical, reticle exposure fields 70.

In FIG. 2, structures, such as integrated circuit devices 22, PCMs 50, or OCMs 60, formed by first reticle exposure field 71 are illustrated without shading, while structures formed by second reticle exposure field 72 are illustrated with dotted shading. In addition, structures formed by third reticle exposure field 73 are illustrated with horizontal line shading, while structures formed by fourth reticle exposure field 74 are illustrated with horizontal dashed line shading.

With continued reference to FIG. 2, each reticle exposure field 70 includes a corresponding first OCM 61, a corresponding second OCM 62, a corresponding third OCM 63, and a corresponding fourth OCM 64. The corresponding first OCM, the corresponding second OCM, the corresponding third OCM, and the corresponding fourth OCM formed by a given reticle exposure field 70 are positioned in different control module die 40 such that a given control module die 40 includes four optical control modules 60, and each optical control module 60 within the given control module die 40 is formed by a different reticle exposure field 70.

With reference to a central control module die 41 that is illustrated in the specific example of FIG. 2, first OCM 61, which is illustrated with dotted fill, can be formed by second reticle exposure field 72; and second OCM 62, which is illustrated with horizontal dashed line shading, can be formed by fourth reticle exposure field 74. Similarly, third OCM 63, which is illustrated with horizontal line shading, can be formed by third reticle exposure field 73; and fourth OCM 64, which is illustrated without shading, can be formed by first reticle exposure field 71.

As illustrated and discussed, reticle exposure fields 70 overlap with one another within overlap region 76, thereby permitting the corresponding first, second, third, and fourth OCMs, which are patterned by different reticle exposure fields, to be positioned within the same control module die (i.e., central control module die 41 in FIG. 2). As also illustrated, each reticle exposure field 70 also includes an overlap-free region 78 that is free from overlap with other reticle exposure fields 70.

The above-described relative configuration, or relative orientation, for OCMs 60 within a given reticle exposure field 70, as well as the overlap among adjacent reticle exposure fields 70, can permit reticle exposure fields 70 to be aligned with, or relative to, one another without a need to utilize, or sacrifice, four integrated circuit device positions within die array 20 as control module die 40. With the above-described relative configuration, or relative orientation, for OCMs 60 can permit each reticle exposure field 70 to include four different OCMs 60 (e.g., first OCM 61, second OCM 62, third OCM 63, and fourth OCM 64) that are proximal the four corners of the reticle exposure field without the need to incorporate all four of the OCMs into individual, or dedicated, integrated circuit device positions within the die array.

As such, semiconductor substrates 10 according to some embodiments of the present disclosure, can produce a larger number of integrated circuit devices 22 when compared to prior art semiconductor substrates that utilize four corner die positions of a corresponding die array as control module die. Additionally or alternatively, and since all OCMs 60 are external scribe lines 30, are outside scribe lines 30, or are not positioned within scribe lines 30, semiconductor substrates 10 according to some embodiments of the present disclosure can be, can be more accurately, or can be more readily singulated utilizing die separation techniques when compared to prior art semiconductor substrates that position corresponding optical control modules within corresponding scribe lines. This can be especially true when laser scribe die separation techniques are utilized, as such die separation techniques can be sensitive to optically reflective structures within the scribe lines.

Optical control modules 60 can include any suitable structure that can be utilized to orient or align reticle exposure fields 70 with semiconductor substrate 10 or with each other during formation, or patterning, of integrated circuit devices 22 on semiconductor substrate 10. For example, optical control modules 60 can include structures that can be utilized to automatically align a reticle during the process of manufacturing integrated circuit devices 22 on semiconductor substrate 10.

An example of optical control modules 60 includes rectangular interference fields that can be detected, either by the naked eye or by computer-aided detection devices, and used for reticle adjustment or layer thickness testing. As more specific examples, optical control modules 60 can include square, rectangular, or cross-shaped fields that can be automatically detected by a stepper that utilizes the reticle. These fields also can be referred to herein as interference fields. As an example, automatic alignment utilizing the optical control modules can be accomplished by passing low-energy laser beams through alignment marks on the reticle and reflecting them off corresponding alignment marks, i.e., the optical control modules, on the wafer substrate. An optical control module can have a three-dimensional structure such that it can be used for each exposure step during the manufacture of integrated circuit devices 22. Such three-dimensional structure can permit or facilitate layer-to-layer alignment among the various individual, or vertically stacked, layers of the integrated circuit devices.

As discussed, control module die 40 can include PCM 50. PCM 50 can be formed or defined by a single reticle exposure field 70. As an example, and as discussed, first reticle exposure field 71 can form PCM 50 that is illustrated without shading in FIG. 2, second reticle exposure field 72 can form PCM 50 that is illustrated with dotted shading in FIG. 2, third reticle exposure field 73 can form PCM 50 that is illustrated with horizontal line shading in FIG. 2, and fourth reticle exposure field 74 can form PCM 50 that is illustrated with horizontal dashed shading in FIG. 2. In one embodiment, each reticle exposure field 70 can form a corresponding PCM 50 of a, or of a single, corresponding control module die 40. In another embodiment, an entirety of a given PCM 50 can be formed by the single reticle exposure field 70. However, other embodiments may not include these features.

PCMs 50 can include any suitable structure that can be utilized to monitor a fabrication process for integrated circuit devices 22. Examples of PCMs 50 include electrical test structures that indicate one or more electrical properties indicative of the fabrication process for integrated circuit devices 22, film property test structures that indicate one or more film properties indicative of the fabrication process for integrated circuit devices 22, or lithography test structures that indicate one or more lithographic properties indicative of the fabrication process for integrated circuit devices 22. More specific examples of PCMs 50 include electrical test circuits, thin film thickness test regions, thin film quality test regions, or critical dimension test regions.

Integrated circuit devices 22 can include any suitable structure that can be formed on semiconductor substrate 10. Additionally or alternatively, integrated circuit devices 22 can include any suitable structure that can be singulated or separated, via cutting of semiconductor substrate 10 along scribe lines 30, to produce individual chips, or die, that can include a processor, memory, a transistor, an optoelectronic device, a logic element, a circuit element, a digital electronic device, an analog electronic device, or any other suitable semiconductor-based device.

Semiconductor substrate 10 can include any suitable semiconductor substrate. Examples of semiconductor substrate 10 include a silicon substrate, a germanium arsenide substrate, gallium nitride, or a III-V semiconductor substrate.

Figure 3:
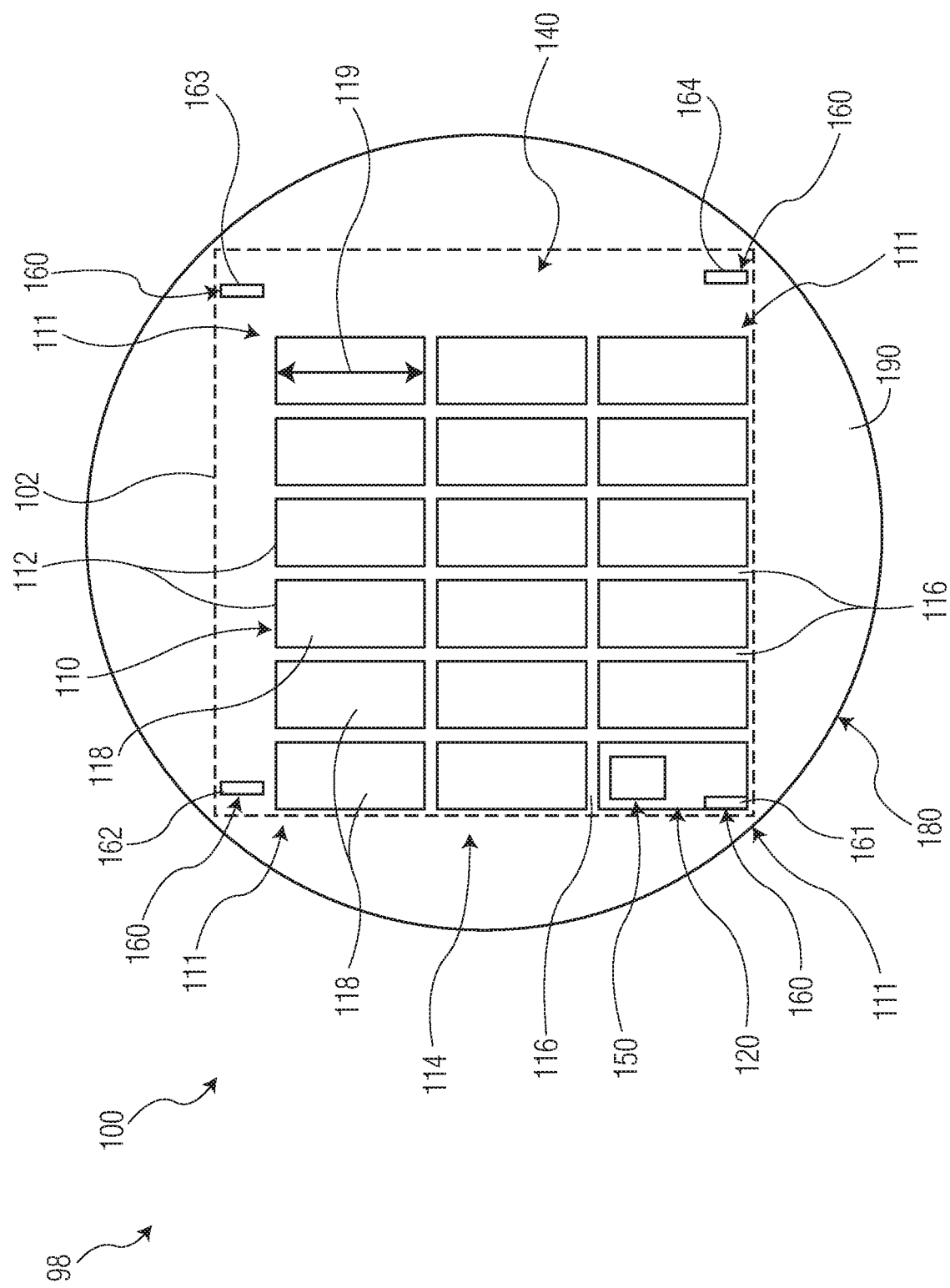
FIG. 3 is a schematic illustration of an example of a reticle that can be utilized to pattern a semiconductor substrate, according to the present disclosure.

FIG. 3 is a schematic illustration of an example of a reticle 100 that can be utilized to pattern a semiconductor substrate, such as semiconductor substrate 10 of FIGS. 1-2, according to the present disclosure. Reticle 100 can be utilized with, or within, a photolithography system 98 to pattern a plurality of integrated circuit devices, such as integrated circuit devices 22 of FIGS. 1-2, on the semiconductor substrate. FIG. 3 illustrates reticle 100 in the context of a field of view 190 of a lens 180 of photolithography system 98.

Reticle 100 includes an array region 110 and a margin region 140. Array region 110 includes patterning 112 that represents a device layer 118 of the plurality of integrated circuit devices. Within array region 110, patterning 112 is arranged in a two-dimensional grid 114 that includes scribe lines 116 separating adjacent device layers 118. Scribe lines 116 can be horizontal or vertical. The two-dimensional grid also can be referred to herein as a lattice field, as an array, or as a plurality of rows and columns. Horizontal scribe lines can be equidistant from one another and can run parallel to the rows. Similarly, vertical scribe lines can be equidistant from one another and can run parallel to the columns. The array region also includes patterning that represents a control module die 120, which also can be referred to herein as a control module die 120. Control module die 120 includes patterning that represents a first optical control module (OCM) 160, as indicated at 161. Examples of optical control modules are disclosed herein.

Margin region 140 is external to array region 110 such that margin region 140 is external, or outside, device layers 118 and also is external, or outside, scribe lines 116. Margin region 140 extends along at least two adjacent sides of array region 110 and includes patterning that represents a second OCM 160, as indicated at 162, patterning that represents a third OCM 160, as indicated at 163, and patterning that represents a fourth OCM 160, as indicated at 164.

As discussed in more detail herein, the patterning that represents OCMs 160 is arranged, or has a relative spacing, such that, upon patterning of four adjacent reticle exposure fields 102 on the surface of the substrate, a first OCM, a second OCM, a third OCM, and a fourth OCM all are patterned within a corresponding, or a single, control module die. This can be true even though reticle 100, or a single reticle exposure field that is formed thereby, only includes patterning that represents a single OCM 160 within the patterning that represents control module die 120, as illustrated in FIG. 3. The patterning that represents the first OCM, the patterning that represents the second OCM, the patterning that represents the third OCM, and the patterning that represents the fourth OCM can be arranged, on reticle 100 and relative to one another, such that a first OCM that is formed by a first exposure, a second OCM that is formed by a second exposure, a third OCM that is formed by a third exposure, and a fourth OCM that is formed by a fourth exposure all are positioned within a single control module die. Such a configuration can decrease an overall fraction of die positions within two-dimensional grid 114 that includes patterning that represents control module die 120, thereby increasing a number of integrated circuit devices that can be formed on a given substrate, as described herein.

Array region 110 can be a rectangular array region 110 that forms, or defines, four corners 111. In such a configuration, each OCM 160 can be proximate a corresponding corner 111 of the array region. However, a distance, or an average distance, between each OCM 160 and the corresponding corner can be different for each OCM. Such a configuration can permit or facilitate the relative orientation of four OCMs 160 within a single control module die 120 upon patterning of four adjacent reticle exposure fields on the semiconductor substrate, as discussed herein.

As a specific example, and with continued reference to FIG. 3, patterning that represents first OCM 161 can be within the rectangular array region and proximate a first corner 111 of the four corners. In contrast, patterning that represents second OCM 162 can be external the rectangular array region and proximate a second corner 111 of the four corners, patterning that represents third OCM 163 can be external the rectangular array region and proximate a third corner 111 of the four corners, and patterning that represents fourth OCM 164 can be external the rectangular array region and proximate a fourth corner 111 of the four corners. The first corner, the second corner, the third corner, and the fourth corner are different corners of the rectangular array region.

In the context of the spatial relationship among OCMs 160, or between OCMs 160 and corresponding corners 111, the term "proximate" can refer to a relative distance between a given OCM 160 and the corresponding corner 111 when compared to a distance between the given OCM and another corner 111. As a more specific example, device layers 118 can have a maximum dimension 119, and each OCM 160 can be less than maximum dimension 119 away from the corresponding corner 111 but can be greater than the maximum dimension away from the other corners 111.

As illustrated in FIG. 3, array region 110 can include patterning that represents a process control module (PCM) 150. The patterning that represents process control module 150 can be positioned within control module die 120, as illustrated. In addition, one or more other positions, or die locations, within two-dimensional grid 114 can include patterning that represents process control module 150. Examples of process control modules are disclosed.

As used herein, the phrase "patterning that represents" can refer to patterning, structure, a template, or markings that can be defined by a combination of optically opaque and optically transparent regions on reticle 100. This patterning will project an image of device layers 118, of control module die 120, of PCMs 150, and of OCMs 160 onto a substrate when the reticle is utilized within the photolithography system or when electromagnetic radiation is shined through the reticle and onto the substrate. Such patterning also can be referred to herein as patterning that corresponds to or as patterning that defines.

Figure 6:
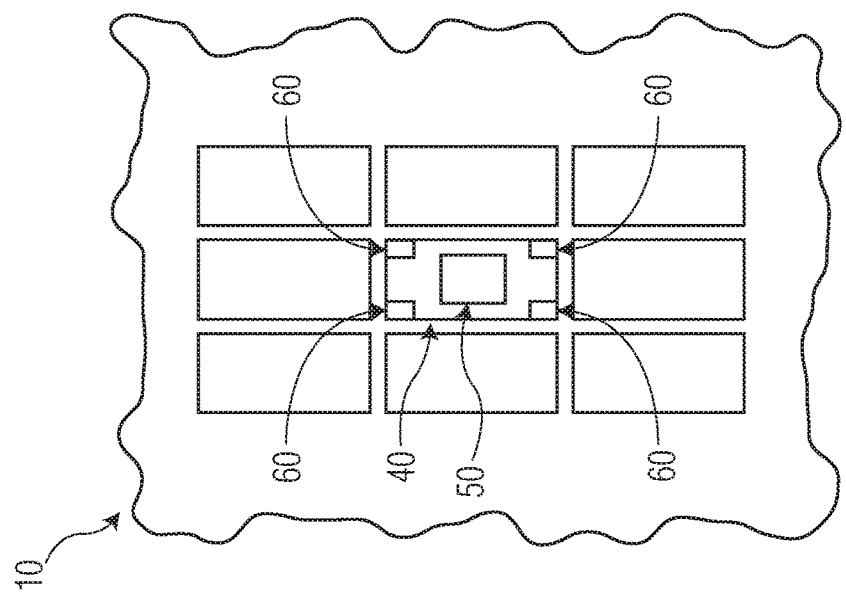
FIG. 6 is a schematic illustration of an example of a relative orientation among a plurality of optical control modules, according to the present disclosure.
Figure 5:
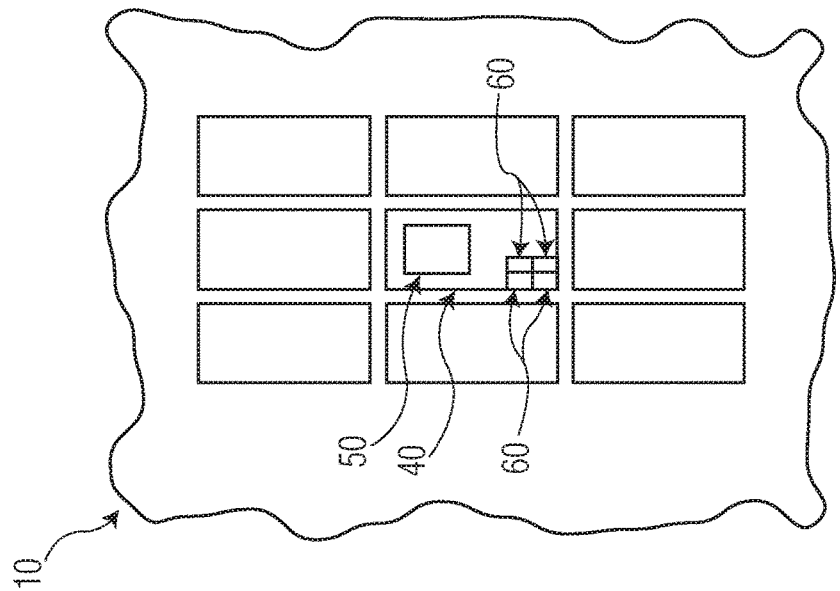
FIG. 5 is a schematic illustration of an example of a relative orientation among a plurality of optical control modules, according to the present disclosure.
Figure 4:
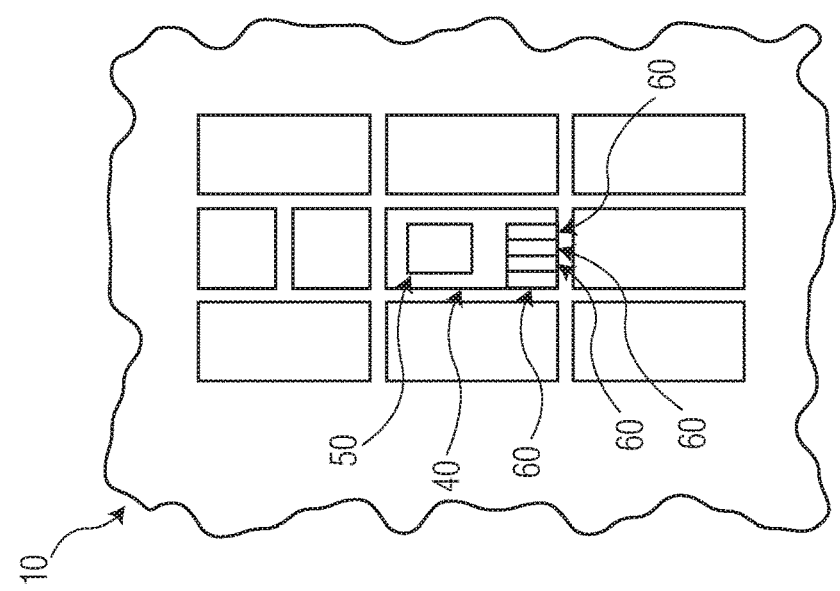
FIG. 4 is a schematic illustration of an example of a relative orientation among a plurality of optical control modules, according to the present disclosure.

FIGS. 4-6 are a schematic illustrations of examples of relative orientations among a plurality of OCMs 60 that can be formed on a semiconductor substrate 10, according to the present disclosure. FIGS. 4-6 illustrate variations on the relative arrangement of OCMs 60 that can be incorporated into semiconductor substrate 10 of FIGS. 1-2. In addition, and while FIGS. 4-6 illustrate OCMs 60 in the context of patterning on semiconductor substrate 10, one of ordinary skill in the art will understand that similar relative orientations for patterning that represents OCMs 160 on reticle 100 of FIG. 3 also are within the scope of the present disclosure. Furthermore, the examples of FIGS. 4-6 simply are examples, and any relative arrangement of four OCMs 60 within a single control module die 40, with each OCM 60 being formed by a different reticle exposure field, also is within the scope of the present disclosure.

As illustrated in FIG. 4, OCMs 60 can be arranged adjacent to, or touching, one another and in a line. As illustrated in FIG. 5, OCMs 60 can be arranged adjacent to, or touching one another and in a rectangle, or a square, with each OCM 60 forming a corresponding corner, or quadrant, of the rectangle, or square. As illustrated in FIG. 6, OCMs 60 can be spaced-apart from one another or can define corresponding corners of control module die 40.

Figure 7:
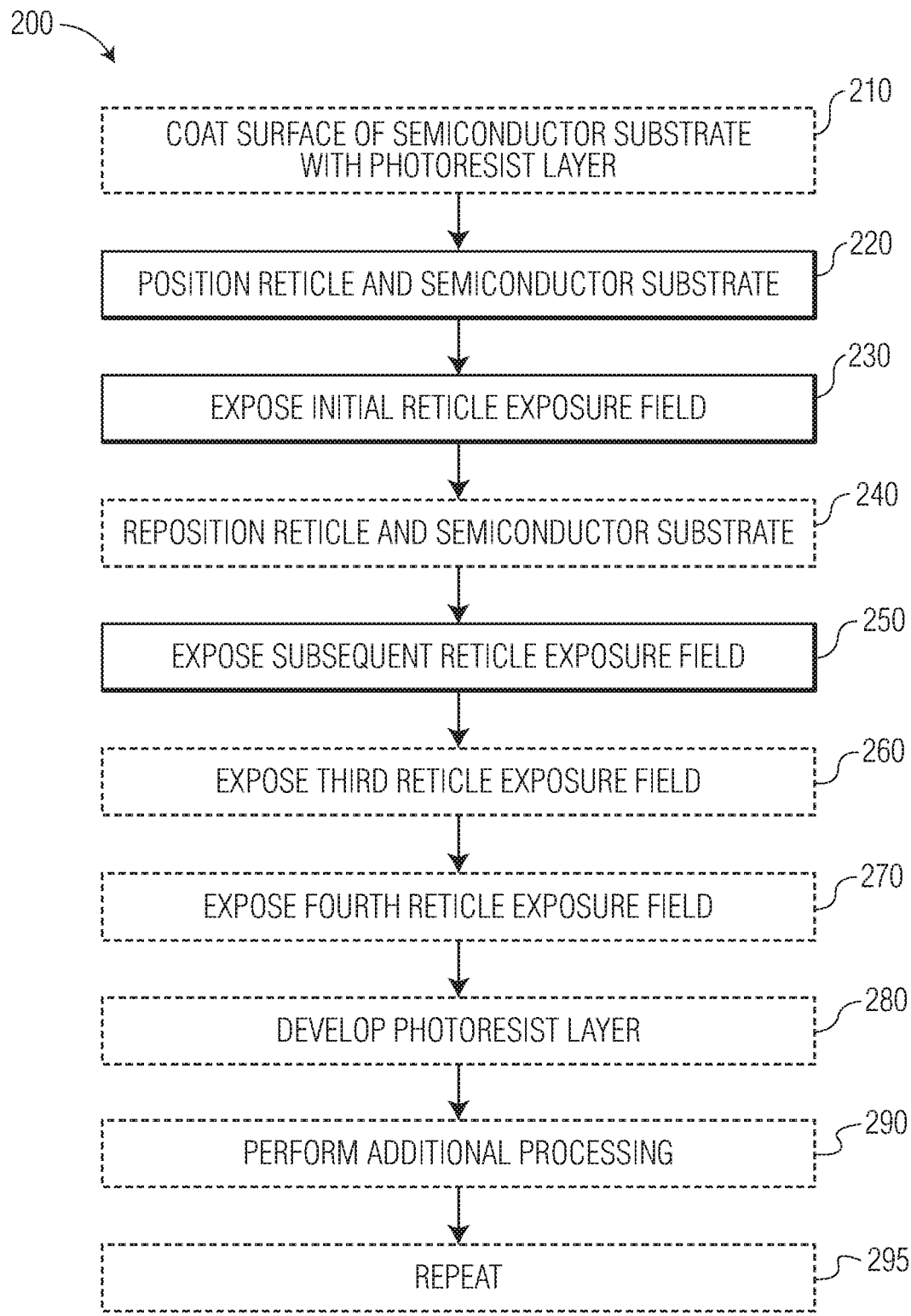
FIG. 7 is a flowchart depicting methods of forming a plurality of integrated circuit devices on a surface of a semiconductor substrate, according to the present disclosure.

FIG. 7 is a flowchart depicting methods 200 of making an integrated circuit device, according to the present disclosure. FIGS. 8-11 are schematic illustrations of examples of portions of the method of FIG. 7. Methods 200 can include coating a surface of a semiconductor substrate with a photoresist layer at 210 and include positioning a reticle and the semiconductor substrate at 220. Methods 200 also include exposing an initial reticle exposure field at 230 and can include repositioning the reticle and the semiconductor substrate at 240. Methods 200 further include exposing a subsequent reticle exposure field at 250 and can include exposing a third reticle exposure field at 260, exposing a fourth reticle exposure field at 270, or developing the photoresist layer at 280. Methods 200 also can include performing additional processing at 290 or repeating at least a portion of the methods at 295.

Coating the surface of the semiconductor substrate with the photoresist layer at 210 can include coating the surface of the semiconductor substrate with any suitable photoresist layer in any suitable manner. As an example the coating at 210 can include spin-coating the surface of the semiconductor substrate with the photoresist layer. Examples of the photoresist layer include negative photoresist layers and positive photoresist layers. The coating at 210 can be performed with any suitable timing or sequence during methods 200. As an example, the coating at 210 can be performed prior to the positioning at 220 or prior to the exposing at 230. Examples of the semiconductor substrate are disclosed herein with reference to semiconductor substrate 10 of FIGS. 1-2 and 4-6.

Positioning the reticle and the semiconductor substrate at 220 can include positioning the reticle and the semiconductor substrate relative to one another or positioning such that the initial reticle exposure field is positioned at a predetermined, or desired, location on the surface of the semiconductor substrate during the exposing at 230. The positioning at 220 can be performed with, via, or utilizing a photolithography system, such as a stepper, and can include moving the reticle relative to the semiconductor substrate or moving the semiconductor substrate relative to the reticle. Examples of the reticle are disclosed herein with reference to reticle 100 of FIG. 3.

Exposing the initial reticle exposure field at 230 can include exposing the initial reticle exposure field via the reticle and on the surface of the semiconductor substrate. As discussed herein, the reticle can include an array region and a margin region. The array region can include patterning that represents a device layer of a plurality of integrated circuit devices and is arranged in a two-dimensional grid that includes scribe lines separating adjacent device layers of adjacent integrated circuit devices of the plurality of integrated circuit devices. The array region also can include a control module die that includes patterning that represents a first optical control module (OCM) of the device layer. As also discussed herein, the margin region is external the array region and includes patterning that represents a second OCM of the device layer, patterning that represents a third OCM of the device layer, and patterning that represents a fourth OCM of the device layer. With this in mind, the exposing at 230 can include exposing to pattern, form, or define an initial array region and an initial margin region on the semiconductor substrate. Examples of the array region and of the margin region are disclosed herein with reference to reticle 100 of FIG. 3.

Figure 8:
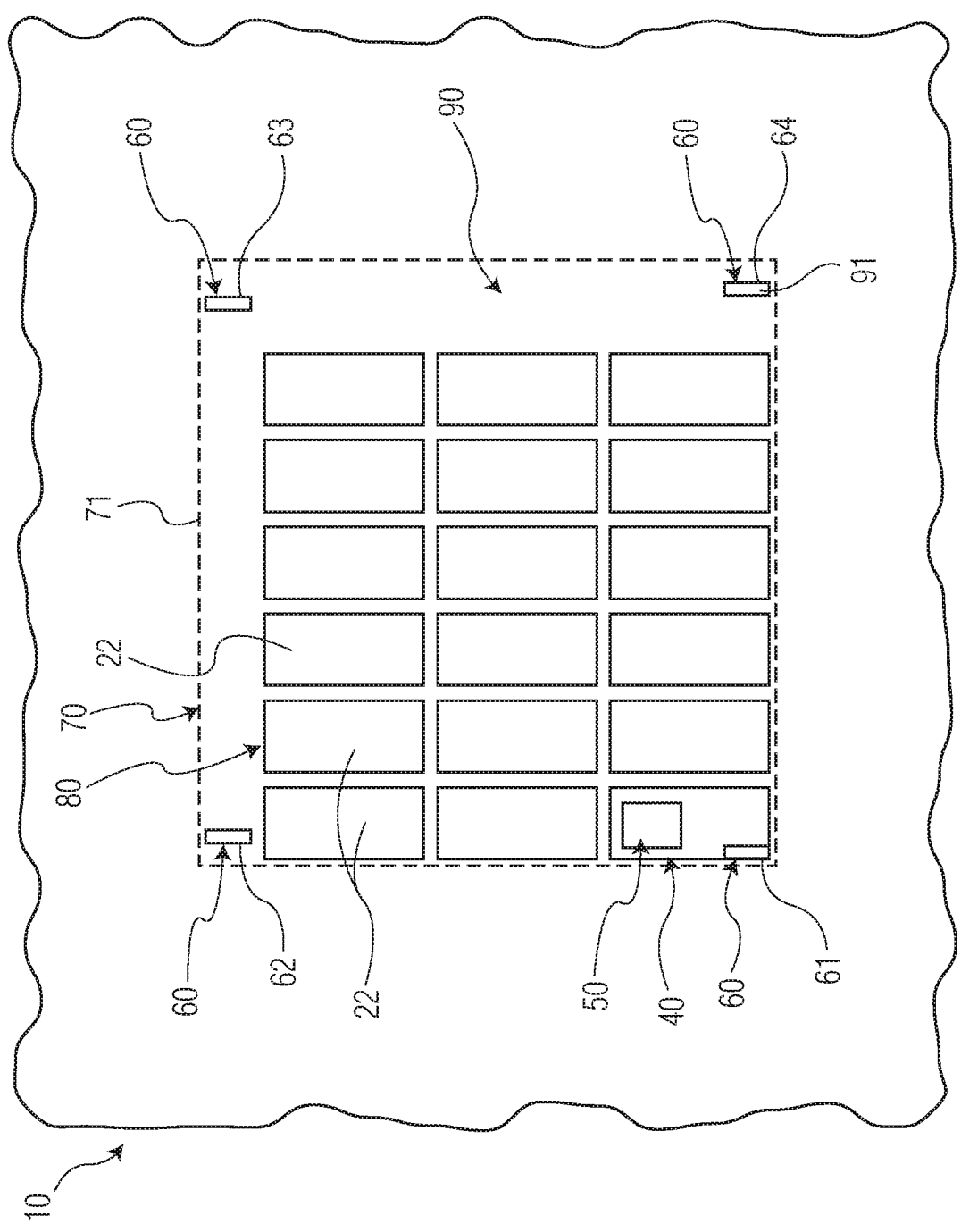
FIG. 8 is a schematic illustration of an example of a portion of the method of FIG. 7.

The exposing at 230 is illustrated in FIG. 8. As illustrated therein, an initial, or a first, reticle exposure field 70, which is indicated at 71 and illustrated in dashed lines, can expose, form, or define a corresponding array region 80 and a corresponding margin region 90 on a surface of a semiconductor substrate 10. The exposing at 230 also can be referred to herein as an initial exposure.

Repositioning the reticle and the semiconductor substrate at 240 can include repositioning such that the subsequent reticle exposure field, which is exposed during the exposing at 250, is positioned at a predetermined, or desired, location on the surface of the semiconductor substrate that is adjacent to the initial reticle exposure field. The repositioning at 240 can be performed with, via, or utilizing the photolithography system and can include moving the reticle relative to the semiconductor substrate or moving the semiconductor substrate relative to the reticle. The repositioning at 240 additionally or alternatively can include utilizing the first OCM, the second OCM, the third OCM, or the fourth OCM, which were patterned during the exposing at 230, to align the subsequent reticle exposure field with the initial reticle exposure field.

Exposing the subsequent reticle exposure field at 250 can include exposing the subsequent reticle exposure field via the reticle and on the surface of the semiconductor substrate. This can include exposing to pattern, form, or define a subsequent array region and a subsequent margin region on the semiconductor substrate. The exposing at 250 can include exposing such that the subsequent reticle exposure field partially overlaps with the initial reticle exposure field or such that an initial OCM that is patterned during the exposing the initial reticle exposure field and a subsequent OCM that is patterned during the exposing the subsequent reticle exposure field both are positioned within the same, or with a single, control module die.

As discussed, the exposing at 250 includes exposing such that the subsequent reticle exposure field overlaps, or at least partially overlaps, with the initial reticle exposure field. As an example, at least one, or even two, of a first OCM that is patterned during the exposing the initial reticle exposure field, a second OCM that is patterned during the exposing the initial reticle exposure field, a third OCM that is patterned during the exposing the initial reticle exposure field, and a fourth OCM that is patterned during the exposing the initial reticle exposure field can be positioned at least partially, or even completely, within the subsequent reticle exposure field. Similarly, at least one, or even two, of a first OCM that is patterned during the exposing the subsequent reticle exposure field, a second OCM that is patterned during the exposing the subsequent reticle exposure field, a third OCM that is patterned during the exposing the subsequent reticle exposure field, and a fourth OCM that is patterned during the exposing the subsequent reticle exposure field can be positioned at least partially, or even completely, within the initial reticle exposure field.

Additionally or alternatively, at least one, or even two, of the first OCM that is patterned during the exposing the initial reticle exposure field, the second OCM that is patterned during the exposing the initial reticle exposure field, the third OCM that is patterned during the exposing the initial reticle exposure field, and the fourth OCM that is patterned during the exposing the initial reticle exposure field can be positioned at least partially, or even completely, external the subsequent reticle exposure field. Similarly, at least one, or even two, of the first OCM that is patterned during the exposing the subsequent reticle exposure field, the second OCM that is patterned during the exposing the subsequent reticle exposure field, the third OCM that is patterned during the exposing the subsequent reticle exposure field, and the fourth OCM that is patterned during the exposing the subsequent reticle exposure field can be positioned at least partially, or even completely, external the initial reticle exposure field.

Figure 9:
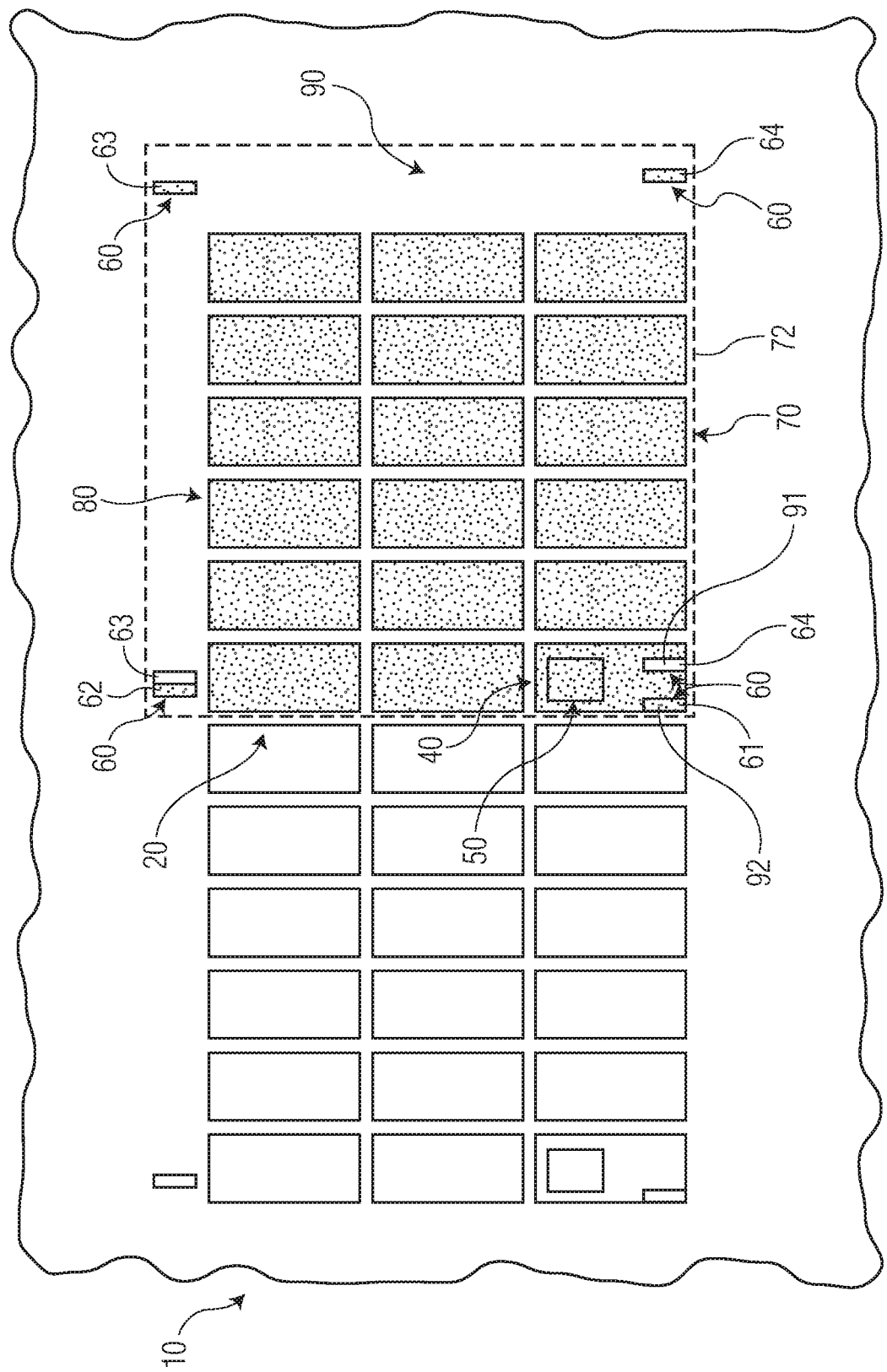
FIG. 9 is a schematic illustration of an example of a portion of the method of FIG. 7.

The exposing at 250 is illustrated in FIG. 9. As illustrated therein, a subsequent, or a second, reticle exposure field 70, which is indicated at 72 and illustrated in dashed lines, can expose, form, or define a corresponding array region 80 and a corresponding margin region 90 on a surface of a semiconductor substrate 10. As also illustrated therein, an initial OCM 60, which is indicated at 91 and was patterned during the exposing at 230, is within a single control module die 40 that also includes a subsequent OCM 60, which is indicated at 92 and was patterned during the exposing at 250. The exposing at 250 also can be referred to herein as a subsequent exposure.

Subsequent to the exposing at 250 and prior to the exposing at 260, methods 200 may include repeating the repositioning at 240. This may include repeating such that the third reticle exposure field, which is exposed during the exposing at 260, is positioned at a predetermined, or desired, location on the surface of the semiconductor substrate that is adjacent to the subsequent reticle exposure field, that is adjacent to the initial reticle exposure field, or that partially overlaps with both the initial reticle exposure field and the subsequent reticle exposure field.

Exposing the third reticle exposure field at 260 can include exposing, via the reticle, the third reticle exposure field to the surface of the semiconductor substrate. This can include exposing to pattern, form, or define a third array region and a third margin region on the semiconductor substrate. The exposing at 260 can include exposing such that the third reticle exposure field partially overlaps with the initial reticle exposure field and with the subsequent reticle exposure field. Additionally or alternatively, the exposing at 260 can include exposing such that the initial OCM that is patterned during the exposing the initial reticle exposure field, the subsequent OCM that is patterned during the exposing the subsequent reticle exposure field, and a tertiary OCM that is patterned during the exposing the third reticle exposure field all are positioned within the same, or within the single, control module die.

Figure 10:
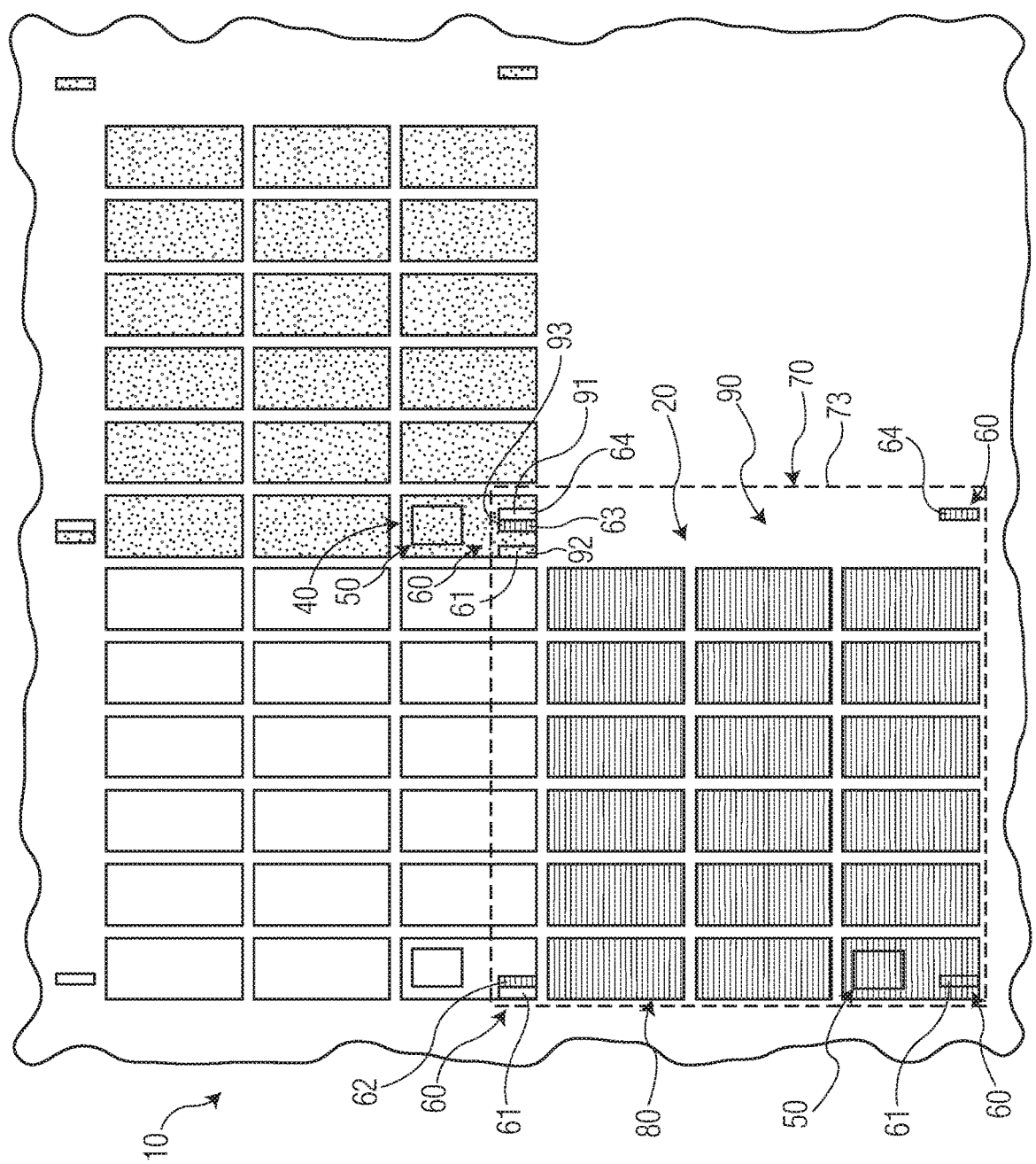
FIG. 10 is a schematic illustration of an example of a portion of the method of FIG. 7.

The exposing at 260 is illustrated in FIG. 10. As illustrated therein, a third reticle exposure field 70, which is indicated at 73 and illustrated in dashed lines, can expose, form, or define a corresponding array region 80 and a corresponding margin region 90 on a surface of a semiconductor substrate 10. As also illustrated therein, tertiary OCM 60, which is indicated at 93 and was patterned during the exposing at 260, is within the single control module die that also includes initial OCM 91 and subsequent OCM 92. The exposing at 260 also can be referred to herein as a third exposure.

Subsequent to the exposing at 260 and prior to the exposing at 270, methods 200 may include repeating the repositioning at 240. This may include repeating such that the fourth reticle exposure field, which is exposed during the exposing at 270, is positioned at a predetermined, or desired, location on the surface of the semiconductor substrate that is adjacent to the subsequent reticle exposure field, that is adjacent to the initial reticle exposure field, that is adjacent to the third reticle exposure field, or that partially overlaps with the initial reticle exposure field, the subsequent reticle exposure field, and the third reticle exposure field.

Exposing the fourth reticle exposure field at 270 can include exposing, via the reticle, the fourth reticle exposure field to the surface of the semiconductor substrate. This can include exposing to pattern, form, or define a fourth array region and a fourth margin region on the semiconductor substrate. The exposing at 270 can include exposing such that the fourth reticle exposure field partially overlaps with the initial reticle exposure field, with the subsequent reticle exposure field, and with the third reticle exposure field. Additionally or alternatively, the exposing at 270 can include exposing such that the initial OCM that is patterned during the exposing the initial reticle exposure field, the subsequent OCM that is patterned during the exposing the subsequent reticle exposure field, the tertiary OCM that is patterned during the exposing the third reticle exposure field, and a quaternary OCM that is patterned during the exposing the fourth reticle exposure field all are positioned within the same, or within the single, control module die.

Figure 11:
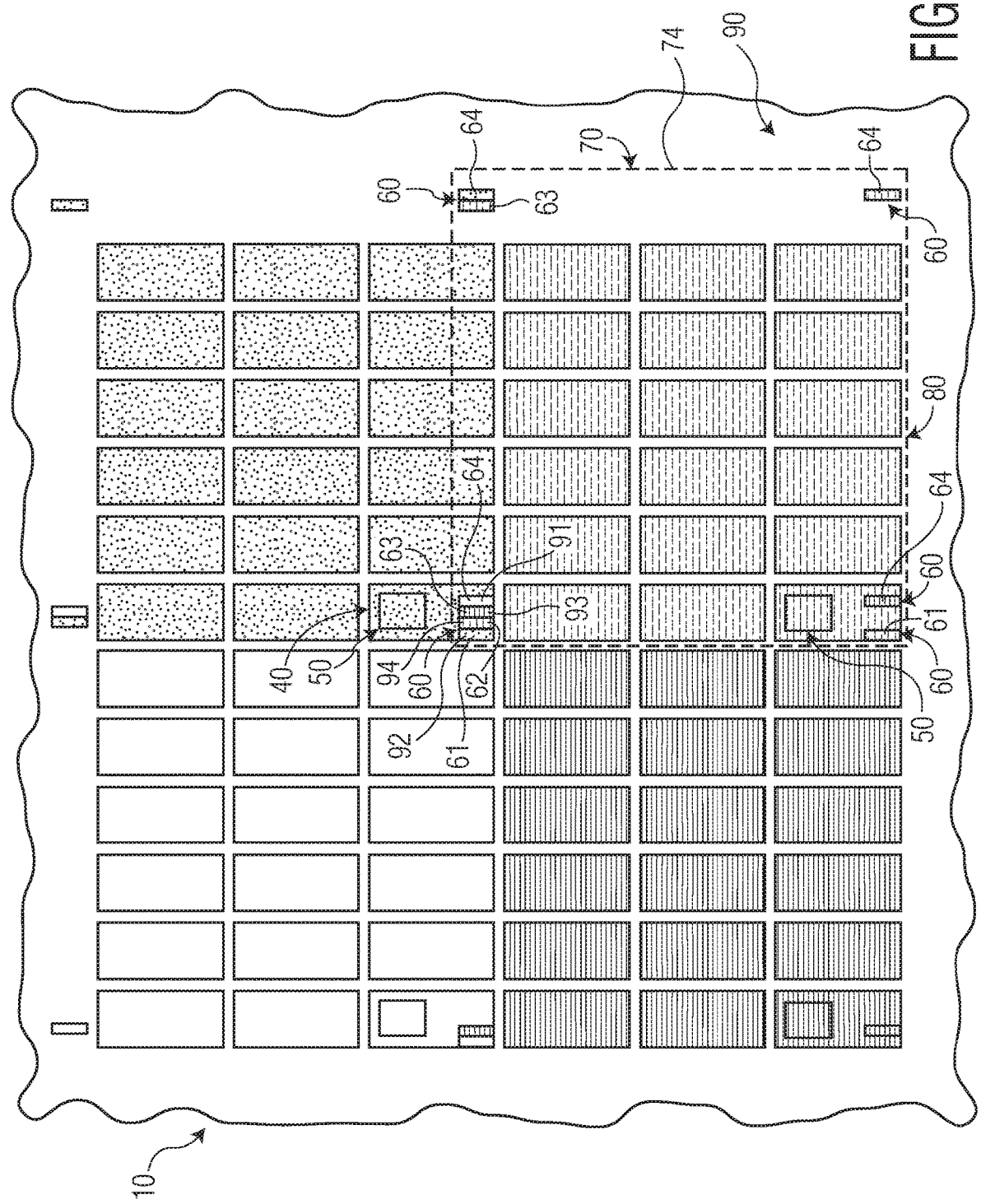
FIG. 11 is a schematic illustration of an example of a portion of the method of FIG. 7.

The exposing at 270 is illustrated in FIG. 11. As illustrated therein, a fourth reticle exposure field 70, which is indicated at 74 and illustrated in dashed lines, can expose, form, or define a corresponding array region 80 and a corresponding margin region 90 on a surface of a semiconductor substrate 10. As also illustrated therein, quaternary OCM 60, which is indicated at 94 and was patterned during the exposing at 270, is within the single control module die that also includes initial OCM 91, subsequent OCM 92, and tertiary OCM 93. The exposing at 280 also can be referred to herein as a fourth exposure.

As illustrated in FIGS. 8-11, the control module die of the reticle also can include patterning that represents at least one process control module (PCM). Under these conditions, the single control module die also can include a corresponding PCM, as indicated in FIGS. 8-11 at 50. The corresponding PCM that is included within the single control module die can be patterned during only one of the exposing at 230, the exposing at 250, the exposing at 260, and the exposing at 270.

Methods 200 have been disclosed herein in the context of exposing an initial reticle exposure field at 230, exposing a subsequent reticle exposure field at 250, exposing a third reticle exposure field at 260, and exposing a fourth reticle exposure field at 270. The adjectives initial, subsequent, third, and fourth are utilized for convenience, and it is within the scope of embodiments of the present invention that the exposing at 230, the exposing at 250, the exposing at 260, and the exposing at 270 can be performed in any suitable order or sequence.

Developing the photoresist layer at 280 can include developing to form or define a photoresist pattern on the surface of the semiconductor substrate. The developing at 280 can include removing, or dissolving, regions of the photoresist layer to form the pattern, with these regions of the photoresist layer being defined based upon the exposing at 230, the exposing at 250, the exposing at 260, or the exposing at 270.

Performing additional processing at 290 can include performing any suitable additional, or conventional, processing of, or on, the semiconductor substrate to form, define, or make the integrated circuit device. As an example, the reticle can be a first reticle that includes a first array region and a first margin region and the photoresist layer may be a first photoresist layer. In this example, and subsequent to the developing at 280, the performing at 290 can include defining the device layer of the plurality of integrated circuit devices on the semiconductor substrate. As examples, the device layer can be defined by etching or implanting the semiconductor substrate utilizing the first photoresist layer as a mask, or template.

The performing at 290 also can include removing the photoresist pattern from the semiconductor substrate. The photoresist pattern can be removed from the semiconductor substrate subsequent to the defining the device layer, such as by dissolving or burning away the photoresist pattern.

Repeating at least the portion of methods 200 at 295 can include repeating any suitable portion of methods 200 in any suitable order. As an example, and subsequent to the performing at 290, the repeating at 295 can include repeating the coating at 210 to coat the surface of the semiconductor substrate with a second photoresist layer.

As another example, the repeating at 295 can include repeating the positioning at 220, repeating the exposing at 230, and repeating the exposing at 250 with, or utilizing, a second reticle that includes a second array region and a second margin region. The second reticle can differ from the first reticle. The second reticle can include a corresponding first OCM, a corresponding second OCM, a corresponding third OCM, and a corresponding fourth OCM.

During the repeating the exposing at 250, the repeating at 295 can include aligning the first OCM, the second OCM, the third OCM, and the fourth OCM of the subsequent reticle exposure field that is exposed via the second reticle with the first OCM, the second OCM, the third OCM, and the fourth OCM of the subsequent reticle exposure field exposed via the first reticle. Such methods can provide layer-to-layer alignment between the subsequent reticle exposure field defined by the first reticle and the subsequent reticle exposure field defined by the second reticle.

The performing at 290 and the repeating at 295 can be performed any suitable number of times to form or define any suitable number of layers of the plurality of integrated circuit devices. Subsequent to formation of all, or of all desired, layers of the plurality of integrated circuit devices, the performing at 290 further can include singulating the plurality of integrated circuit devices, such as to define a plurality of distinct integrated circuit devices. This can include cutting the substrate utilizing die separation techniques, examples of which are disclosed herein.

Subsequent to the singulating, the performing at 290 can include packaging the plurality of distinct integrated circuit devices to form a plurality of distinct packaged integrated circuit devices or implementing one or more of the plurality of packaged integrated circuit devices into an electronic system. Examples of the integrated circuit devices include processors, digital devices, analog devices, memory devices, sensors, programmable logic devices, or discrete devices.

Although the invention is described herein with reference to specific embodiments, various modifications and changes can be made without departing from the scope of the present invention as set forth in the claims below. For example, and as discussed, OCMs 60 can have any suitable location within control module die 40. As another example, the labels of first, second, third, and fourth for OCMs 60 defined by a given reticle exposure field 70 are arbitrarily utilized, and are not intended to denote a specific order or sequence for OCMs 60. Similarly, the labels of initial, subsequent, third, and fourth for reticle exposure fields 70 are arbitrarily utilized, and are not intended to denote a specific order or sequence in which the reticle exposure fields are defined or positioned. Accordingly, the specification and Figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any of the claims.

Unless stated otherwise, terms such as "first," "second," "third," and "fourth" are used to arbitrarily distinguish between the elements such terms describe. Thus, these terms are not necessarily intended to indicate temporal relationships, spatial relationships, or other prioritization of such elements.

As used herein the terms "adapted" and "configured" mean that the element, component, or other subject matter is designed, or intended, to perform a given function. Thus, the use of the terms "adapted" and "configured" should not be construed to mean that a given element, component, or other subject matter is simply "capable of" performing a given function but that the element, component, or other subject matter is specifically selected, created, implemented, utilized, programmed, or designed for the purpose of performing the function. It is also within the scope of embodiments of the present invention that elements, components, or other recited subject matter that is recited as being adapted to perform a particular function can additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of embodiments of the present invention.

The following are various embodiments of the present invention.

In a first embodiment, there is provided a method of making an integrated circuit device. The method includes positioning a reticle and a semiconductor substrate relative to one another. The reticle includes an array region and a margin region. The array region includes patterning that represents a device layer of a plurality of integrated circuit devices. The array region is arranged in a two-dimensional grid that includes scribe lines separating adjacent device layers of adjacent integrated circuit devices of the plurality of integrated circuit devices. The array region includes a control module die that includes patterning that represents a first optical control module (OCM) of the device layer. The margin region is external the array region. The margin region includes patterning that represents a second OCM of the device layer, patterning that represents a third OCM of the device layer, and patterning that represents a fourth OCM of the device layer.

The method includes exposing, via the reticle, an initial reticle exposure field on a surface of the semiconductor substrate to pattern an initial array region and an initial margin region on the semiconductor substrate. The method includes exposing, via the reticle, a subsequent reticle exposure field on the surface of the semiconductor substrate to pattern a subsequent array region and a subsequent margin region on the semiconductor substrate. The subsequent reticle exposure field partially overlaps with the initial reticle exposure field such that an initial OCM that is patterned during exposure of the initial reticle exposure field and a subsequent OCM that is patterned during exposure of the subsequent reticle exposure field both are positioned within a single control module die.

Exposing the initial reticle exposure field and exposing the subsequent reticle exposure field can include directing electromagnetic radiation, such as light, through the reticle and incident upon a photoresist layer that can coat the surface of the semiconductor substrate to selectively expose the photoresist layer to the electromagnetic radiation. The method can include coating the surface of the semiconductor substrate with the photoresist layer prior to positioning the reticle and the semiconductor substrate relative to one another. The method can include developing the photoresist layer to form a photoresist pattern on the surface of the semiconductor substrate subsequent to exposing the initial reticle exposure field and exposing the subsequent reticle exposure field.

The reticle can be a first reticle, the array region can be a first array region, the margin region can be a first margin region, and the photoresist layer can be a first photoresist layer. The method can include defining the device layer of the plurality of integrated circuit devices on the semiconductor substrate. The method can include removing the photoresist pattern from the semiconductor substrate. The method can include coating the surface of the semiconductor substrate with a second photoresist layer. The method can include positioning a second reticle and the semiconductor substrate relative to one another. The method can include exposing the initial reticle field via the second reticle. The method can include exposing the subsequent reticle exposure field via the second reticle. The second reticle can include a second array region and a second margin region.

The method can include aligning the first OCM, the second OCM, the third OCM, and the fourth OCM of the initial reticle exposure field exposed via the second reticle with the first OCM, the second OCM, the third OCM, and the fourth OCM of the initial reticle exposure field exposed via the first reticle to provide layer-to-layer alignment of the initial reticle exposure fields. The method can include aligning the first OCM, the second OCM, the third OCM, and the fourth OCM of the subsequent reticle exposure field exposed via the second reticle with the first OCM, the second OCM, the third OCM, and the fourth OCM of the subsequent reticle exposure field exposed via the first reticle to provide layer-to-layer alignment of the subsequent reticle exposure fields.

The method can include exposing, via the reticle, a third reticle exposure field on the surface of the semiconductor substrate. Exposure of the third reticle exposure field can pattern a third array region and a third margin region on the semiconductor substrate. The third reticle exposure field can partially overlap with the initial reticle exposure field and also with the subsequent reticle exposure field. A tertiary OCM can be patterned during exposure of the third reticle exposure field. The tertiary OCM can be positioned within the single control module die that also includes the initial OCM that is patterned during exposure of the initial reticle exposure field and the subsequent OCM that is patterned during exposure of the subsequent reticle exposure field.

The method can include exposing, via the reticle, a fourth reticle exposure field on the surface of the semiconductor substrate. Exposure of the fourth reticle exposure field can pattern a fourth array region and a fourth margin region on the semiconductor substrate. The fourth reticle exposure field can partially overlap with the initial reticle exposure field, with the subsequent reticle exposure field, and also with the third reticle exposure field. A quaternary OCM can be patterned during exposure of the fourth reticle exposure field. The quaternary OCM can be positioned within the single control module die that also includes the initial OCM that is patterned during exposure of the initial reticle exposure field, the subsequent OCM that is patterned during exposure of the subsequent reticle exposure field, and the tertiary OCM that can be patterned during exposure of the third reticle exposure field.

The control module die can include patterning that represents at least one process control module (PCM). The single control module die can include a corresponding PCM. The corresponding PCM can be patterned during exposure of the initial reticle exposure field, during exposure of the subsequent reticle exposure field, during exposure of the third reticle exposure field, or during exposure of the fourth reticle exposure field.

Two of the following can be external the second reticle exposure field: (1) a second OCM that can be patterned during exposure of the initial reticle exposure field, (2) a third OCM that can be patterned during exposure of the initial reticle exposure field, and (3) a fourth OCM that can patterned during exposure of the initial reticle exposure field. Two of the following can be external the first reticle exposure field: (1) a first OCM that can be patterned during the exposure of the subsequent reticle exposure field, (2) a third OCM that can be patterned during exposure of the subsequent reticle exposure field, and (3) a fourth OCM that can be patterned during exposure of the subsequent reticle exposure field.

The method can include singulating the semiconductor substrate into a plurality of distinct integrated circuit devices. The method can include packaging the plurality of distinct integrated circuit devices to define a plurality of distinct packaged electronic devices.

In a second embodiment, there is provided a reticle. The reticle is configured to be utilized within a photolithography system to pattern a device layer of a corresponding plurality of integrated circuit devices on a semiconductor substrate. The reticle includes an array region. The array region includes patterning that represents the device layer. Within the array region, the patterning that represents the device layer is arranged in a two-dimensional grid. The two-dimensional grid comprises scribe lines. The scribe lines separate adjacent device layers of adjacent integrated circuit devices of the plurality of integrated circuit devices. The array region includes a control module die. The control module die includes patterning that represents a first optical control module (OCM).

The reticle includes a margin region external the array region. The margin region extends along at least two adjacent sides of the array region. The margin region includes patterning that represents a second OCM, patterning that represents a third OCM, and patterning that represents a fourth OCM.

The array region further can include patterning that represents a process control module (PCM).

The first OCM, the second OCM, the third OCM, and the fourth OCM can be arranged, on the reticle and relative to one another, such that, upon patterning of four adjacent reticle exposure fields of the reticle, on the semiconductor substrate and with the photolithography system, an initial OCM formed by an initial exposure, a subsequent OCM formed by a subsequent exposure, a tertiary OCM formed by a third exposure, and a quaternary OCM formed by a fourth exposure can be positioned within a single control module die.

The array region can be a rectangular array region that forms four corners. The first OCM can be within the rectangular array region and proximate a first corner of the four corners. The second OCM can be external the rectangular array region and proximate a second corner of the four corners. The third OCM can be external the rectangular array region and proximate a third corner of the four corners. The fourth OCM can be external the rectangular array region and proximate a fourth corner of the four corners. Each OCM of the first OCM, the second OCM, the third OCM, and the fourth OCM can be proximate a corresponding corner of the four corners. A distance between each OCM and a corresponding corner can be different for each OCM.

The first OCM, the second OCM, the third OCM, and the fourth OCM all can be positioned outside the scribe lines.

In a third embodiment, there is provided a semiconductor substrate. The semiconductor substrate includes a plurality of integrated circuit devices. The plurality of integrated circuit devices is arranged in a die array on a surface of the semiconductor substrate. The semiconductor substrate includes a plurality of scribe lines. The plurality of scribe lines separate adjacent integrated circuit devices of the plurality of integrated circuit devices.

The semiconductor substrate includes a plurality of control module die. The plurality of control module die is spaced-apart within the die array. Each control module die of the plurality of control module die includes a first optical control module (OCM), a second OCM, a third OCM, and a fourth OCM.

The die array forms a repeating pattern formed by a plurality of partially overlapping reticle exposure fields. Each reticle exposure field of the plurality of partially overlapping reticle exposure fields includes a corresponding first OCM, a corresponding second OCM, a corresponding third OCM, and a corresponding fourth OCM. Each corresponding OCM is positioned within a different control module die of the plurality of control module die.

The plurality of partially overlapping reticle exposure fields can include a first rectangular reticle exposure field, a second rectangular reticle exposure field, a third rectangular reticle exposure field, and a fourth rectangular reticle exposure field. The second rectangular reticle exposure field can partially overlap with the first rectangular reticle exposure field. The third rectangular reticle exposure field can partially overlap with the first rectangular reticle exposure field and the second rectangular reticle exposure field. The fourth rectangular reticle exposure field can partially overlap with the first rectangular reticle exposure field, the second rectangular reticle exposure field, and the third rectangular reticle exposure field.

The first rectangular reticle exposure field, the second rectangular reticle exposure field, the third rectangular reticle exposure field, and the fourth rectangular reticle exposure field all can overlap within an overlap region. The overlap region can form the first OCM, the second OCM, the third OCM, and the fourth OCM.

What is claimed is:

1. A method of making an integrated circuit device, the method comprising:
   positioning a reticle and a semiconductor substrate relative to one another, wherein
   (i) the reticle comprises an array region and a margin region;
   (ii) the array region comprises patterning that represents a device layer of a plurality of integrated circuit devices and is arranged in a two-dimensional grid that comprises scribe lines separating adjacent device layers of adjacent integrated circuit devices of the plurality of integrated circuit devices;
   (iii) the array region further comprises a control module die that comprises patterning that represents a first optical control module (OCM) of the device layer; and (iv) the margin region is external the array region and comprises patterning that represents a second OCM of the device layer, patterning that represents a third OCM of the device layer, and patterning that represents a fourth OCM of the device layer;

exposing, via the reticle, an initial reticle exposure field on a surface of the semiconductor substrate to pattern an initial array region and an initial margin region on the semiconductor substrate; and exposing, via the reticle, a subsequent reticle exposure field on the surface of the semiconductor substrate to pattern a subsequent array region and a subsequent margin region on the semiconductor substrate, wherein the subsequent reticle exposure field partially overlaps with the initial reticle exposure field such that an initial OCM that is patterned during the exposing the initial reticle exposure field and a subsequent OCM that is patterned during the exposing the subsequent reticle exposure field both are positioned within a single control module die.

2. The method of claim 1, wherein, the exposing the initial reticle exposure field and the exposing the subsequent reticle exposure field comprise directing electromagnetic radiation through the reticle and incident upon a photoresist layer that coats the surface of the semiconductor substrate to selectively expose the photoresist layer to the electromagnetic radiation.

3. The method of claim 1, wherein:
(i) prior to the positioning, the method further comprises coating the surface of the semiconductor substrate with a photoresist layer; and
(ii) subsequent to the exposing the initial reticle exposure field and the exposing the subsequent reticle exposure field, the method further comprises developing the photoresist layer to form a photoresist pattern on the surface of the semiconductor substrate.

4. The method of claim 3, wherein the reticle is a first reticle that comprises a first array region and a first margin region, wherein the photoresist layer is a first photoresist layer, and further wherein the method comprises:
(i) defining the device layer of the plurality of integrated circuit devices on the semiconductor substrate;
(ii) removing the photoresist pattern from the semiconductor substrate;
(iii) coating the surface of the semiconductor substrate with a second photoresist layer; and
(iv) repeating the positioning, the exposing the initial reticle exposure field, and the exposing the subsequent reticle exposure field with a second reticle that includes a second array region and a second margin region.

5. The method of claim 4, wherein the repeating includes:
(i) during the repeating the exposing the initial reticle exposure field, aligning the first OCM, the second OCM, the third OCM, and the fourth OCM of the initial reticle exposure field exposed via the second reticle with the first OCM, the second OCM, the third OCM, and the fourth OCM of the initial reticle exposure field exposed via the first reticle to provide layer-to-layer alignment of the initial reticle exposure fields; and
(ii) during the repeating the exposing the subsequent reticle exposure field, aligning the first OCM, the second OCM, the third OCM, and the fourth OCM of the subsequent reticle exposure field exposed via the second reticle with the first OCM, the second OCM, the third OCM, and the fourth OCM of the subsequent reticle exposure field exposed via the first reticle to provide layer-to-layer alignment of the subsequent reticle exposure fields.

6. The method of claim 1, wherein the method further comprises exposing, via the reticle, a third reticle exposure field on the surface of the semiconductor substrate to pattern a third array region and a third margin region on the semiconductor substrate, wherein the third reticle exposure field partially overlaps with the initial reticle exposure field and also with the subsequent reticle exposure field such that a tertiary OCM that is patterned during the exposing the third reticle exposure field is positioned within the single control module die that also comprises the initial OCM that is patterned during the exposing the initial reticle exposure field and the subsequent OCM that is patterned during the exposing the subsequent reticle exposure field.

7. The method of claim 6, wherein the method further comprises exposing, via the reticle, a fourth reticle exposure field on the surface of the semiconductor substrate to pattern a fourth array region and a fourth margin region on the semiconductor substrate, wherein the fourth reticle exposure field partially overlaps with the initial reticle exposure field, with the subsequent reticle exposure field, and also with the third reticle exposure field such that a quaternary OCM that is patterned during the exposing the fourth reticle exposure field is positioned within the single control module die that also comprises the initial OCM that is patterned during the exposing the initial reticle exposure field, the subsequent OCM that is patterned during the exposing the subsequent reticle exposure field, and the tertiary OCM that is patterned during the exposing the third reticle exposure field.

8. The method of claim 7, wherein the control module die further comprises patterning that represents at least one process control module (PCM), and further wherein the single control module die comprises a corresponding PCM that is patterned during only one of the exposing the initial reticle exposure field, the exposing the subsequent reticle exposure field, the exposing the third reticle exposure field, and the exposing the fourth reticle exposure field.

9. The method of claim 1, wherein:
(i) two of a second OCM that is patterned during the exposing the initial reticle exposure field, a third OCM that is patterned during the exposing the initial reticle exposure field, and a fourth OCM that is patterned during the exposing the initial reticle exposure field are external the second reticle exposure field; and
(ii) two of a first OCM that is patterned during the exposing the subsequent reticle exposure field, a third OCM that is patterned during the exposing the subsequent reticle exposure field, and a fourth OCM that is patterned during the exposing the subsequent reticle exposure field are external the first reticle exposure field.

10. The method of claim 1, wherein the method further includes singulating the semiconductor substrate into a plurality of distinct integrated circuit devices.

11. The method of claim 10, wherein the method further includes packaging the plurality of distinct integrated circuit devices to define a plurality of distinct packaged electronic devices.

* * * * *